(12) United States Patent
Boday et al.

(10) Patent No.: US 10,265,812 B2
(45) Date of Patent: Apr. 23, 2019

(54) LIQUID-COOLED, COMPOSITE HEAT SINK ASSEMBLIES

(71) Applicant: INTERNATIONAL BUSINESS MACHINES CORPORATION, Armonk, NY (US)

(72) Inventors: Dylan J. Boday, Tucson, AZ (US); Levi A. Campbell, Poughkeepsie, NY (US); Milnes P. David, Fishkill, NY (US); Dustin W. Demetriou, Poughkeepsie, NY (US); Michael J. Ellsworth, Jr., Poughkeepsie, NY (US); Roger R. Schmidt, Poughkeepsie, NY (US); Robert E. Simons, Poughkeepsie, NY (US); Prabjit Singh, Poughkeepsie, NY (US); Jason T. Wertz, Pleasant Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 668 days.

(21) Appl. No.: 14/824,492

(22) Filed: Aug. 12, 2015

(65) Prior Publication Data

US 2017/0045300 A1    Feb. 16, 2017

(51) Int. Cl.
*B23P 15/26* (2006.01)
*F28D 7/00* (2006.01)
(Continued)

(52) U.S. Cl.
CPC ............ *B23P 15/26* (2013.01); *H01L 23/473* (2013.01); *H01L 23/4735* (2013.01);
(Continued)

(58) Field of Classification Search
CPC ............... H01L 23/473; H01L 23/4735; H01L 7/20254; F28F 3/02; F28F 3/12
(Continued)

(56) References Cited

U.S. PATENT DOCUMENTS

| | | |
|---|---|---|
| 3,524,497 A | 8/1970 | Chu et al. |
| 4,538,171 A | 8/1985 | Stevens et al. |

(Continued)

FOREIGN PATENT DOCUMENTS

| | | |
|---|---|---|
| CN | 2013-83909 Y | 1/2010 |
| CN | 103402344 A | 11/2013 |

(Continued)

OTHER PUBLICATIONS

Anonymous, "Method for an LGA Package Socket Assembly with a Threaded Socket Cap and Integrated Load Ring", IP.com, IPCOM000019059D, published Aug. 27, 2003 (5 pages).

(Continued)

*Primary Examiner* — Keith M Raymond
*Assistant Examiner* — Nael N Babaa
(74) *Attorney, Agent, or Firm* — Tihon Poltavets, Esq.; Kevin P. Radigan, Esq.; Heslin Rothenberg Farley & Mesiti P.C.

(57) ABSTRACT

Liquid-cooled heat sink assemblies are provided which include: a heat transfer element including a heat transfer base with opposite first and second sides and a plurality of thermally conductive fins extending from the first side, and with the second side of the heat transfer base to couple to a component(s) to be cooled. The heat sink assembly further includes a coolant-carrying structure attached to the heat transfer element. The coolant-carrying structure includes a coolant-carrying base, and a coolant-carrying compartment through which liquid coolant flows. The coolant-carrying base includes a plurality of fin-receiving openings sized and (Continued)

positioned for the plurality of thermally conductive fins to extend therethrough. The plurality of thermally conductive fins extend into the coolant-carrying compartment through which the liquid coolant flows. In one or more embodiments, the heat transfer element is a metal structure and the coolant-carrying structure is a plastic structure.

17 Claims, 10 Drawing Sheets

(51) Int. Cl.
*H01L 23/473* (2006.01)
*H05K 7/20* (2006.01)
*F28F 3/12* (2006.01)
*F28F 3/02* (2006.01)

(52) U.S. Cl.
CPC ..... *H05K 7/20254* (2013.01); *H05K 7/20772* (2013.01); *B23P 2700/10* (2013.01); *F28F 3/02* (2013.01); *F28F 3/12* (2013.01)

(58) Field of Classification Search
USPC ........................................................ 165/80.4
See application file for complete search history.

(56) References Cited

U.S. PATENT DOCUMENTS

| | | | |
|---|---|---|---|
| 4,750,031 A | 6/1988 | Miller et al. | |
| 5,660,759 A | 8/1997 | McCullough | |
| 6,547,210 B1 | 4/2003 | Marx et al. | |
| 6,578,626 B1 | 6/2003 | Calaman et al. | |
| 6,719,039 B2 | 4/2004 | Calaman et al. | |
| 6,778,393 B2 | 8/2004 | Messina et al. | |
| 6,826,054 B2 | 11/2004 | Liu | |
| 6,892,801 B1 | 5/2005 | Kim | |
| 7,092,255 B2 | 8/2006 | Barson et al. | |
| 7,450,378 B2 | 11/2008 | Nelson et al. | |
| 7,486,514 B2 | 2/2009 | Campbell et al. | |
| 7,518,233 B1 | 4/2009 | Takahashi et al. | |
| 7,751,918 B2 | 7/2010 | Campbell et al. | |
| 2006/0191675 A1 | 8/2006 | Fletcher | |
| 2007/0069420 A1 | 3/2007 | Kozyra et al. | |
| 2008/0216691 A1* | 9/2008 | Stephens | B41F 27/005 101/378 |
| 2008/0230208 A1 | 9/2008 | Rasmussen | |
| 2008/0296256 A1 | 12/2008 | Panek | |
| 2011/0067841 A1 | 3/2011 | Doo et al. | |
| 2012/0140403 A1* | 6/2012 | Lau | H01L 23/427 361/679.47 |
| 2012/0175094 A1 | 7/2012 | Rice | |
| 2012/0327603 A1 | 12/2012 | Beaupre et al. | |

FOREIGN PATENT DOCUMENTS

| | | |
|---|---|---|
| JP | 04-048764 A | 2/1992 |
| JP | 2003-047258 A | 2/2003 |
| JP | 2006-339403 A | 12/2006 |
| JP | 2009-206271 A | 9/2009 |
| WO | WO 20151033724 A1 | 3/2015 |

OTHER PUBLICATIONS

Campbell et al., "Composite Heat Sink Structures", U.S. Appl. No. 14/546,136, filed Nov. 18, 2014 (59 pages).
Campbell et al., "Liquid-Cooled Heat Sink Assemblies", U.S. Appl. No. 14/546,159, filed Nov. 18, 2014 (52 pages).
Boday, Dylan J., "Liquid-Cooled, Composite Heat Sink Assemblies", U.S. Appl. No. 14/922,338, filed Oct. 26, 2015 (35 pages).
Boday, Dylan J., "List of IBM Patents and/or Patent Applications Treated as Related", U.S. Appl. No. 14/824,492, filed Aug. 12, 2015, dated Mar. 10, 2016 (2 pages).

* cited by examiner

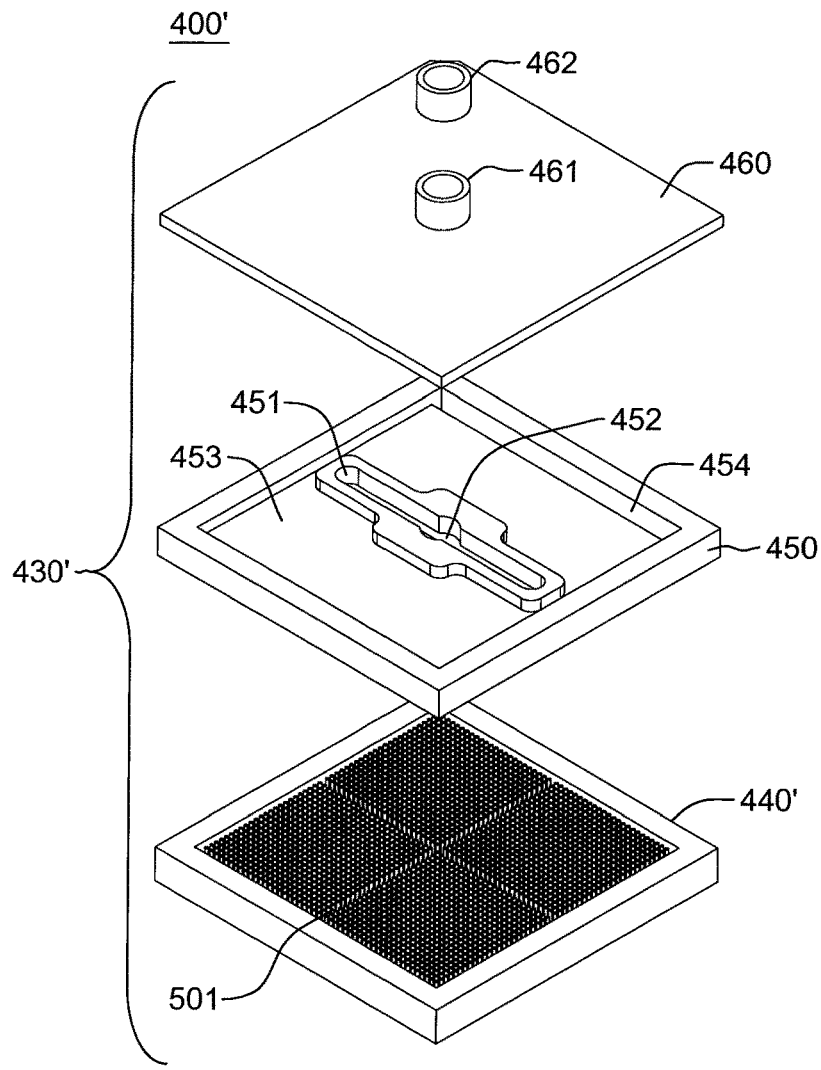
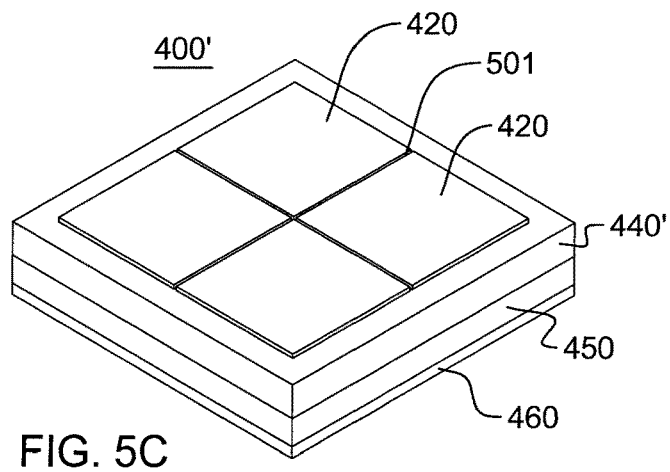
FIG. 5B
FIG. 5C

LIQUID-COOLED, COMPOSITE HEAT SINK ASSEMBLIES

BACKGROUND

As is known, operating electronic components produce heat, which should be removed in an effective manner in order to maintain device junction temperatures within desirable limits, with failure to do so resulting in excessive component temperatures, potentially leading to thermal runaway conditions. Several trends in the electronics industry have combined to increase the importance of thermal management, including in technologies where thermal management has traditionally been less of a concern, such as complementary metal oxide semiconductor (CMOS) technologies. In particular, the need for faster and more densely packed circuits has had a direct impact on the importance of thermal management. For instance, power dissipation, and therefore heat production, increases as device operating frequencies increase. Also, increased operating frequencies may be possible at lower device junction temperatures. Further, as more and more components are packed onto a single chip, heat flux (Watts/cm$^2$) increases, resulting in the need to dissipate more power from a given size chip, module, or system. These trends have combined to create applications where traditional air cooling methods alone, such as methods using air cooled heat sinks with heat pipes or vapor chambers, are unable to remove sufficient heat.

The need to cool current and future high heat load, high heat flux electronic components thus mandates the continued development of more aggressive thermal management techniques using, for instance, liquid cooling. Various types of liquid coolants and liquid-cooling approaches are known, and provide different cooling capabilities. For instance, fluids such as refrigerants or other dielectric liquids (e.g., fluorocarbon liquids) exhibit lower thermal conductivity and specific heat properties, compared to liquids such as water or other aqueous fluids, but may be placed in direct physical contact with electronic components and their associated interconnects without adverse effects, such as corrosion or electrical short circuits. Other cooling liquids, such as water or other aqueous fluids, exhibit superior thermal conductivity and specific heat compared to dielectric fluids. However, water-based coolants must be separated from physical contact with the electronic components and interconnects, since corrosion and electrical short circuit problems are otherwise likely to result. This is typically accomplished by flowing the liquid coolant through a liquid-cooled heat sink or cold plate.

BRIEF SUMMARY

In one aspect, provided herein is an apparatus which includes a liquid-cooled heat sink assembly. The liquid-cooled heat sink assembly includes: a heat transfer element; and a coolant-carrying structure attached to the heat transfer element. The heat transfer element includes a heat transfer base having opposite first and second sides, and a plurality of thermally conductive fins extending from the first side of the heat transfer base, with the second side of the heat transfer base to couple to at least one component to be cooled. The coolant-carrying structure includes a coolant-carrying base, and a coolant-carrying compartment through which the liquid coolant flows. The coolant-carrying base includes a plurality of fin-receiving openings sized and positioned for the plurality of thermally conductive fins of the heat transfer element to extend therethrough. The plurality of thermally conductive fins extend through the plurality of fin-receiving openings in the coolant-carrying base into the coolant-carrying compartment of the coolant-carrying structure through which the liquid coolant flows.

In another aspect, an apparatus is provided herein which includes at least one electronic component to be cooled, and a liquid-cooled heat sink assembly coupled to the at least one electronic component to facilitate cooling of the electronic component(s). The liquid-cooled heat sink assembly includes: a heat transfer element and a coolant-carrying structure attached to the heat transfer element. The heat transfer element includes a heat transfer base having opposite first and second sides, and a plurality of thermally conductive fins extending from the first side of the heat transfer base. The second side of the heat transfer base is coupled to the at least one electronic component to be cooled. The coolant-carrying structure includes a coolant-carrying base, and a coolant-carrying compartment through which the liquid coolant flows. The coolant-carrying base includes a plurality of fin-receiving openings sized and positioned for the plurality of thermally conductive fins of the heat transfer element to extend therethrough, wherein the plurality of thermally conductive fins extend through the plurality of fin-receiving openings in the coolant-carrying base into the coolant-carrying compartment of the coolant-carrying structure through which the liquid coolant flows.

In a further aspect, a method is provided which includes: fabricating a liquid-cooled heat sink assembly to cool at least one component. The fabricating of the liquid-cooled heat sink assembly includes: providing a heat transfer element comprising a heat transfer base having opposite first and second sides, and a plurality of thermally conductive fins extending from the first side of the heat transfer base, the second side of the heat transfer base to couple to the at least one component to be cooled; providing a coolant-carrying structure, the coolant-carrying structure including a coolant-carrying base, and a coolant-carrying compartment through which liquid coolant flows, the coolant-carrying base comprising a plurality of fin-receiving openings sized and positioned for the plurality of thermally conductive fins of the heat transfer base to extend therethrough; and attaching the heat transfer element and the coolant-carrying structure together with the plurality of thermally conductive fins extending through the plurality of fin-receiving openings in the coolant-carrying base into the coolant-carrying compartment of the coolant-carrying structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 5B is a top, exploded isometric view of a heat sink sub-assembly comprising the coolant-carrying base of the coolant-carrying structure and the multiple heat transfer elements illustrated in FIG. 5A as part of the liquid-cooled heat sink assembly, in accordance with one or more aspects of the present invention; and FIG. 5C is a bottom isometric view of the heat sink sub-assembly of FIG. 5B, in accordance with one or more aspects of the present invention.

DETAILED DESCRIPTION

In a data center or computer room installation, multiple electronics racks may be disposed in one or more rows, with the data center housing several hundred, or even several thousand, microprocessors within the electronics racks. Note that "electronics rack", "rack", "information technology (IT) rack", etc., may be used interchangeably herein, and unless otherwise specified, include any housing, frame, support, structure, compartment, etc., having one or more heat generating components of a computer system, electronic system, IT system, etc. Note also that reference is made below to the drawings, which are not drawn to scale for ease of understanding of the various aspects of the present invention, and that the same reference numbers used throughout different figures designating the same or similar components.

In one embodiment, an air-cooled data center may have a raised floor layout, where multiple electronics racks are disposed in one or more rows. Such a data center may house several hundred, or even several thousand microprocessors. In one implementation, chilled air enters the computer room via perforated floor tiles from a supply air plenum defined between the raised floor and a base or sub-floor of the room. Cooled air is taken in through louvered covers at air inlet sides of the electronics racks and expelled through the back (i.e., air outlet sides) of the electronics racks. The electronics racks may have one or more air moving devices (e.g., axial or centrifugal fans) to provide forced inlet-to-outlet airflow to cool the electronic components within the system(s) of the rack. The supply air plenum provides cooled air to the air-inlet sides of the electronics racks via perforated floor tiles disposed in a "cold" aisle of the data center. The cooled air is supplied to the under-floor plenum by one or more computer room air-conditioning (CRAC) units, also disposed within the data center. Room air is taken into each air-conditioning unit typically near an upper portion thereof. This room air may comprise in part exhausted air from the "hot" aisles of the data center defined, for example, by opposing air outlet sides of the electronics racks.

Figure 1:
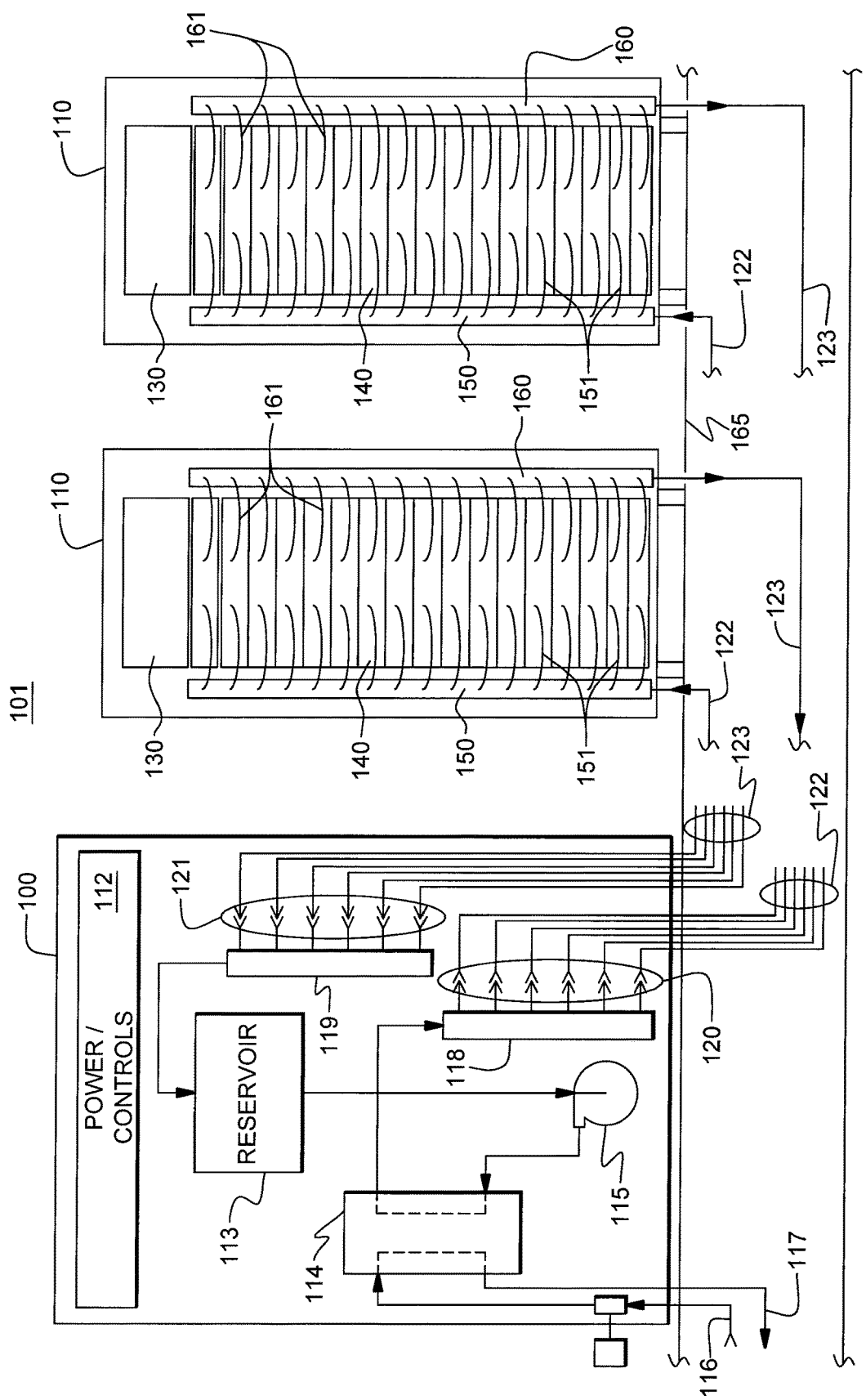
FIG. 1 depicts one embodiment of a liquid-cooled data center comprising a coolant distribution unit which facilitates liquid-cooling of electronics racks of the data center, in accordance with one or more aspects of the present invention.
Figure 2:
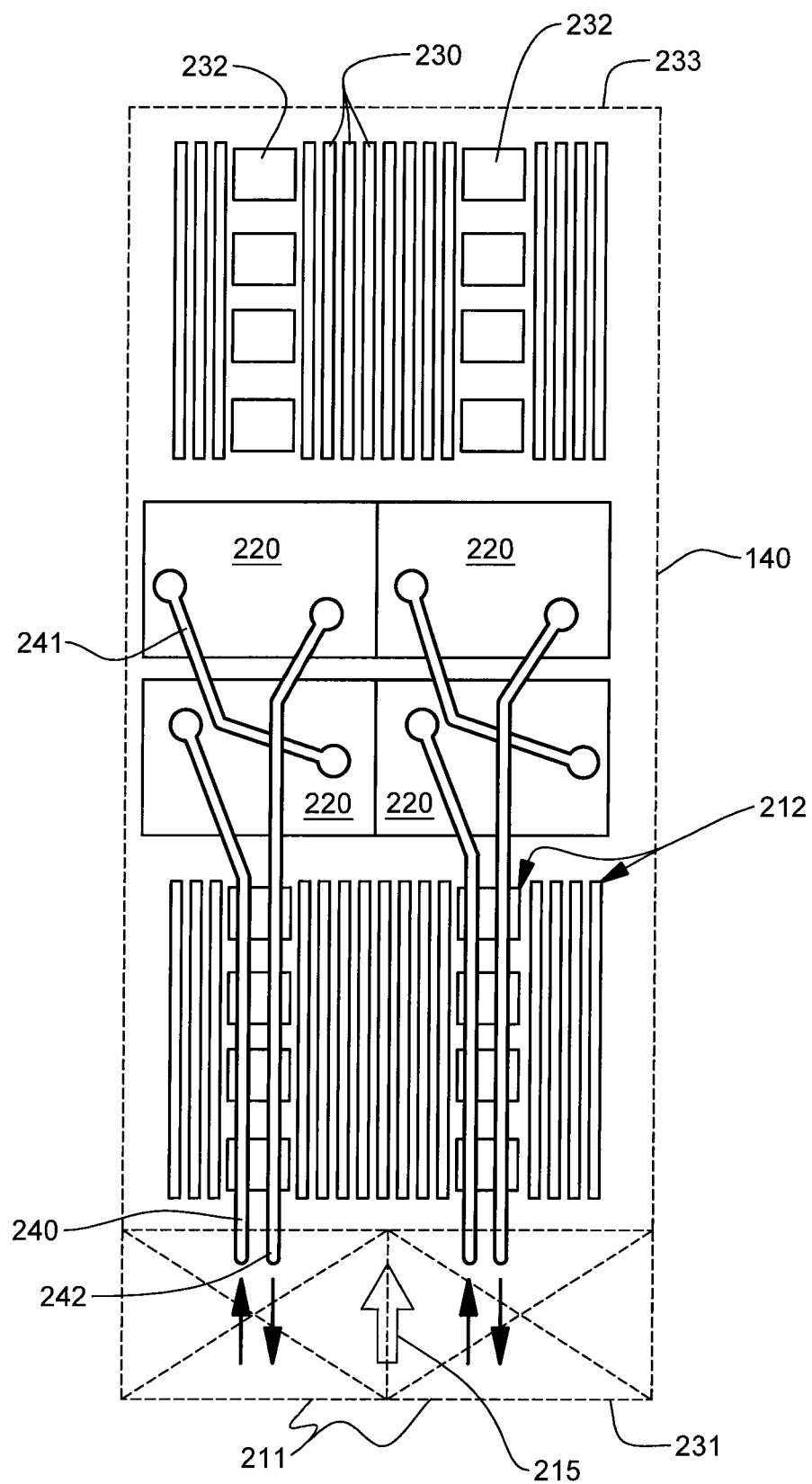
FIG. 2 is a plan view of one embodiment of an electronic system (or node) layout illustrating an air and liquid cooling apparatus for cooling components of the electronic system, in accordance with one or more aspects of the present invention.
Figure 3:
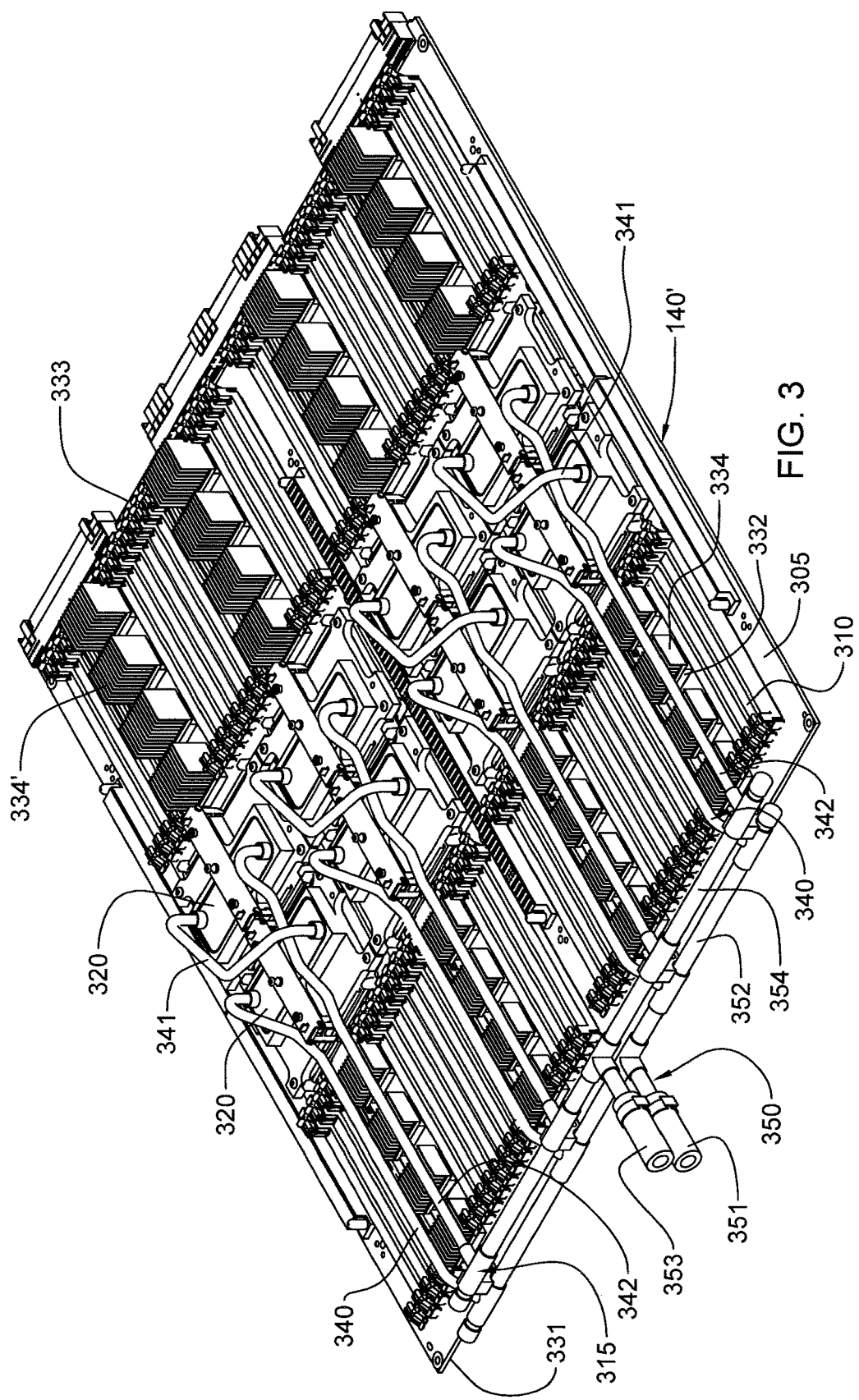
FIG. 3 depicts one detailed embodiment of a partially assembled electronic system layout, wherein the electronic system includes eight heat-generating electronic components to be cooled, each having, in one embodiment, a respective cooling apparatus associated therewith, in accordance with one or more aspects of the present invention.

Due to the ever-increasing airflow requirements through electronics racks, and the limits of air distribution within the typical data center installation, liquid-based cooling may be combined with, or used in place of, conventional air-cooling. FIGS. 1-3 illustrate one embodiment of a data center implementation employing a liquid-based cooling system with one or more liquid-cooled heat sinks coupled to high heat-generating electronic components disposed within one or more electronics racks.

Referring first to FIG. 1, one embodiment of a data center 101 comprising a coolant distribution unit 100, is depicted. The coolant distribution unit may be a relatively large unit which occupies what would be considered a full electronics frame. Within coolant distribution unit 100 is a power/control element 112, a reservoir/expansion tank 113, a heat exchanger 114, a pump 115 (possibly accompanied by a redundant second pump), facility coolant inlet 116 and outlet 117 supply pipes, a supply manifold 118 supplying system coolant to the electronics racks 110 via couplings 120 and lines 122, and a return manifold 119 receiving system coolant from the electronics racks 110, via lines 123 and couplings 121. The electronics racks may include (in one example) a power/control unit 130 for the rack, multiple electronic systems 140, a system coolant supply manifold 150, and a system coolant return manifold 160. As shown, the electronics racks 110 may be disposed on a raised floor 165 of the data center 101, with lines 122 providing system coolant to system coolant supply manifolds 150 and lines 123 facilitating return of system coolant from system coolant return manifolds 160 being disposed in the supply air plenum beneath the raised floor.

In the embodiment illustrated, the system coolant supply manifold 150 provides system coolant to the cooling systems of the electronic systems (such as to liquid-cooled heat sinks thereof) via flexible hose connections 151, which are disposed between the supply manifold and the respective electronic systems within the rack. Similarly, system coolant return manifold 160 is coupled to the electronic systems via flexible hose connections 161. Quick connect couplings may be employed at the interface between flexible hoses 151, 161 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed, for instance, at an air outlet side thereof, which also receives system coolant from the system coolant supply manifold 150 and returns system coolant to the system coolant return manifold 160.

FIG. 2 depicts one embodiment of an electronic system 140 component layout, wherein one or more air moving devices 211 provide forced air flow 215 to cool multiple components 212 within electronic system 140. Cool air is taken in through a front 231 and exhausted out a back 233 of the system. The multiple components to be cooled include multiple processor modules to which liquid-cooled heat sinks 220 (of a liquid-based cooling system) are coupled, as well as multiple arrays of memory modules 230 (e.g., dual in-line memory modules (DIMMs)) and multiple rows of memory support modules 232 (e.g., DIMM control modules) to which air-cooled heat sinks may be coupled. In the embodiment illustrated, memory modules 230 and the memory support modules 232 are partially arrayed near front 231 of electronic system 140, and partially arrayed near back 233 of electronic system 140. Also, in the embodiment of FIG. 2, memory modules 230 and the memory support modules 232 are cooled by air flow 215 across the electronic system.

The illustrated liquid-based cooling system further includes multiple coolant-carrying tubes connected to and in fluid communication with liquid-cooled heat sinks 220. The coolant-carrying tubes comprise sets of coolant-carrying tubes, with each set including (for example) a coolant supply tube 240, a bridge tube 241 and a coolant return tube 242. By way of example only, the set of tubes provide liquid coolant to a series-connected pair of heat sinks 220 (coupled to a pair of processor modules). Coolant flows into a first heat sink of a pair via the coolant supply tube 240 and from the first heat sink to a second heat sink of the pair via bridge tube or line 241, which may or may not be thermally conductive. From the second heat sink of the pair, coolant is returned through the respective coolant return tube 242. Note that in an alternate implementation, one or more of the liquid-cooled heat sinks 220 could be coupled directly to a respective coolant supply tube 240 and coolant return tube 242, that is, without series connecting two or more of the liquid-cooled heat sinks.

By way of further explanation, FIG. 3 depicts an alternate electronic system layout comprising eight processor modules, each having a respective liquid-cooled heat sink of a liquid-based cooling system coupled thereto. The liquid-based cooling system is shown to further include associated coolant-carrying tubes for facilitating passage of liquid coolant through the liquid-cooled heat sinks and a header subassembly to facilitate distribution of liquid coolant to and return of liquid coolant from the liquid-cooled heat sinks. By way of specific example, the liquid coolant passing through the liquid-based cooling subsystem may be cooled and conditioned (e.g., filtered) water.

FIG. 3 is an isometric view of one embodiment of an electronic system or drawer, and a cooling system. The depicted planar server assembly includes a multi-layer printed circuit board to which memory DIMM sockets and various electronic components to be cooled may be attached both physically and electrically. In the cooling system depicted, a supply header is provided to distribute liquid coolant from an inlet to multiple parallel coolant flow paths and a return header collects exhausted coolant from the multiple parallel coolant flow paths into an outlet. Each parallel coolant flow path may include one or more heat sinks in series flow arrangement to facilitate cooling one or more electronic components to which the heat sinks are coupled. The number of parallel paths and the number of series-connected liquid-cooled heat sinks may depend, for example, on the desired component temperature, available coolant temperature and coolant flow rate, and the total heat load being dissipated from the electronic components.

More particularly, FIG. 3 depicts one embodiment of a partially assembled electronic system 140' and an assembled liquid-based cooling system 315 coupled to primary heat-generating components (e.g., including processor die or electronic modules) to be cooled. In this embodiment, the electronic system is configured for (or as) a node of an electronics rack, and includes, by way of example, a support substrate or planar board 305, a plurality of memory module sockets 310 (with the memory modules (e.g., dual in-line memory modules) not shown), multiple rows of memory support modules 332 (each having coupled thereto an air-cooled heat sink 334), and multiple processor modules (not shown) disposed below the liquid-cooled heat sinks 320 of the liquid-based cooling system 315.

In addition to liquid-cooled heat sinks 320, liquid-based cooling system 315 includes multiple coolant-carrying tubes, including coolant supply tubes 340 and coolant return tubes 342 in fluid communication with respective liquid-cooled heat sinks 320. The coolant-carrying tubes 340, 342 are also connected to a header (or manifold) subassembly 350 which facilitates distribution of liquid coolant to the coolant supply tubes and return of liquid coolant from the coolant return tubes 342. In this embodiment, the air-cooled heat sinks 334 coupled to memory support modules 332 closer to front 331 of electronic system 140' are shorter in height than the air-cooled heat sinks 334' coupled to memory support modules 332 near back 333 of electronic system 313. This size difference is to accommodate the coolant-carrying tubes 340, 342 since, in the depicted embodiment, the header subassembly 350 is at the front 331 of the electronics system and the multiple liquid-cooled heat sinks 320 are in the middle.

Liquid-based cooling system 315 comprises, in one embodiment, a pre-configured monolithic structure which includes multiple (pre-assembled) liquid-cooled heat sinks 320 configured and disposed in spaced relation to engage respective heat-generating electronic components. Each liquid-cooled heat sink 320 includes, in one embodiment, a liquid coolant inlet and a liquid coolant outlet, as well as an attachment subassembly (i.e., a heat sink/load arm assembly). Each attachment subassembly is employed to couple its respective liquid-cooled heat sink 320 to the associated electronic component to form the heat sink and electronic component (or device) assemblies depicted. Alignment openings (i.e., thru-holes) may be provided on the sides of the heat sink to receive alignment pins or positioning dowels during the assembly process. Additionally, connectors (or guide pins) may be included within the attachment subassembly to facilitate use of the attachment assembly.

As shown in FIG. 3, header subassembly 350 may include two liquid manifolds, i.e., a coolant supply header 352 and a coolant return header 354, which in one embodiment, may be mechanically coupled together via supporting brackets. In a monolithic cooling structure example, the coolant supply header 352 may be metallurgically bonded in fluid communication to each coolant supply tube 340, while the coolant return header 354 is metallurgically bonded in fluid communication to each coolant return tube 352. By way of example, a single coolant inlet 351 and a single coolant outlet 353 extend from the header subassembly for coupling to the electronics rack's coolant supply and return manifolds, such as shown in FIG. 1.

In one embodiment only, the coolant supply tubes 340, bridge tubes 341 and coolant return tubes 342 in the exemplary embodiment of FIG. 3 may be pre-configured, semi-rigid tubes formed of a thermally conductive material, such as copper or aluminum, and the tubes may be respectively brazed, soldered or welded in a fluid-tight manner to the header subassembly and/or the liquid-cooled heat sinks. The tubes are pre-configured for a particular electronics system to facilitate installation of the monolithic structure in engaging relation with one or more selected components of the electronic system.

In one or more embodiments, the liquid-cooled heat sink(s) of a cooling system, such as described above, may be completely formed of a thermally conductive, metal material, such as copper or aluminum. While effective in assisting cooling of selected electronic components, existing metal-based designs of liquid-cooled heat sinks can be relatively expensive to produce, and heavy in implementation. Further, existing liquid-cooled heat sink configurations are often fabricated with a larger footprint than cooling requirements dictate, to allow space for attaching together the different components of the heat sink. Therefore, to address these issues, disclosed below with reference to FIGS. 4A-5C, are enhanced liquid-cooled heat sink assemblies, which are smaller, less expensive to fabricate, and lighter-weight structures.

In general, disclosed herein are apparatuses which include a liquid-cooled heat sink assembly having a heat transfer element, and a coolant-carrying structure attached to the heat transfer element. The heat transfer element includes a heat transfer base having opposite first and second sides, and a plurality of thermally conductive fins extending from the first side of the heat transfer base. The second side of the heat transfer base is configured to couple to at least one component to be cooled. The coolant-carrying structure is attached to the heat transfer element, and includes a coolant-carrying base, and a coolant-carrying compartment through which liquid coolant flows. In one or more embodiments, the coolant-carrying compartment is defined, in part, by a first side of the coolant-carrying base, and a second side of the coolant-carrying base is coupled to the heat transfer base of the heat transfer element. The coolant-carrying base includes a plurality of fin-receiving openings sized and positioned for the plurality of thermally conductive fins of the heat transfer base to extend therethrough. In particular, the plurality of thermally conductive fins extend through the plurality of fin-receiving openings into the coolant-carrying compartment of the coolant-cooled structure.

In one or more embodiments, the heat transfer element may be fabricated of a different material from the coolant-carrying base or coolant-carrying structure. For instance, the heat transfer element may include or be fabricated of a metal material, such as copper or aluminum, and the coolant-carrying structure may be fabricated of a plastic material. In certain embodiments, the plastic coolant-carrying structure may comprise a thermoplastic, such as: Polyethylene (PE), Polypropylene (PP), Polyvinyl Chloride (PVC), Polytetrafluoroethylene (PTFE), Polyether Ether Keytone (PEEK), etc. In one or more implementations, the plurality of thermally conductive fins and the heat transfer base may be a monolithic metal structure, with the coolant-carrying base being a non-metal base, such as one or more of the above-noted plastic materials.

In one or more embodiments, the liquid-cooled heat sink assembly includes a fluid-tight seal between the heat transfer element and the coolant-carrying structure. For instance, the plurality of fin-receiving openings may be sized and configured to provide an interference fit of the plurality of thermally conductive fins within the plurality of fin-receiving openings, with the interference fit defining, or facilitating defining, the fluid-tight seal between the heat transfer element and the coolant-carrying structure. Additionally, or alternatively, the liquid-cooled heat sink assembly may include an adhesive sealant between the first side of the heat transfer base and the coolant-carrying base. When used, the adhesive sealant may provide, or facilitate providing, the fluid-tight seal between the heat transfer element and the coolant-carrying structure.

In one or more implementations, the plurality of thermally conductive fins extending from the heat transfer base of the heat transfer element may comprise a plurality of thermally conductive pin fins. By way of example, the plurality of thermally conductive pin fins could be monolithically formed as part of the heat transfer element, or metallurgically bonded to the heat transfer base of the heat transfer element. In one or more embodiments, the plurality of thermally conductive pin fins may comprise cylindrical structures extending from the first side of the heat transfer base. In other implementations, other structures could be provided, such as diamond-shaped pin fins, curved pin fins, etc. Further, note that other types of thermally conductive fins could be employed within a liquid-cooled heat sink assembly in accordance with one or more aspects of the present invention. For instance, a plurality of parallel plate fins could be provided extending from the heat transfer base of the heat transfer element into the coolant-carrying compartment of the coolant-carrying structure.

In one or more implementations, the coolant-carrying structure may include a manifold structure including a coolant inlet, a coolant outlet, a coolant inlet manifold region and a coolant outlet manifold region, as well as at least one inlet orifice and at least one outlet orifice. In such configurations, the coolant inlet manifold region may be in fluid communication with the coolant inlet of the coolant-carrying structure, and the coolant outlet manifold region may be in fluid communication with the coolant outlet of the coolant-carrying structure. The at least one inlet orifice is in fluid communication with the coolant inlet manifold region and the coolant-carrying compartment, and the at least one outlet orifice is in fluid communication with the coolant outlet manifold region and the coolant-carrying compartment. In operation, liquid coolant may flow through the coolant inlet, the coolant inlet manifold region, the at least one inlet orifice, the coolant-carrying compartment, the at least one outlet orifice, and the coolant outlet manifold region, to the coolant outlet. Note that although described herein with reference to a coolant-carrying compartment, more than one coolant-carrying compartment could be provided within the liquid-cooled heat sink assembly, if desired.

In one or more implementations, the at least one inlet orifice may include at least one inlet slot positioned over a central region of the coolant-carrying compartment to facilitate introducing the liquid coolant flow into the coolant-carrying compartment in the central region thereof. By way of further example, a plurality of thermally conductive fins may be disposed within the coolant-carrying compartment to facilitate transfer of heat from the electronic component(s) to be cooled to the liquid coolant flowing through the coolant-carrying compartment of the liquid-cooled heat sink assembly. For instance, the plurality of thermally conductive fins could comprise a plurality of parallel-disposed, thermally conductive plate fins, which define channels between the fins, into which coolant is introduced and flows, for example, from a central region of the coolant-carrying compartment out towards a peripheral region of the coolant-carrying compartment. In this configuration, the coolant-carrying structure may include multiple peripheral outlet orifices in fluid communication with the coolant-carrying compartment. Alternatively, the at least one inlet orifice and at least one outlet orifice could be positioned at opposite sides of the plurality of thermally conductive fins, with liquid coolant flowing through the plurality of thermally conductive fins from a first side to a second side of the liquid-cooled heat sink.

In one or more other embodiments, the liquid-cooled heat sink assembly may include a plurality of heat transfer elements, with each heat transfer element including a respective heat transfer base having opposite first and second sides, and a plurality of thermally conductive fins extending from the first side thereof, and with the second side of the heat transfer element to couple to the at least one component to be cooled. In such configurations, the plurality of heat transfer elements of the liquid-cooled heat sink assembly may attach to a common coolant-carrying base of the coolant-carrying structure, and be spaced apart with a gap therebetween, with the respective pluralities of thermally conductive fins extending through respective pluralities of fin-receiving openings in the coolant-carrying base into the coolant-carrying compartment. With such a configuration, differences in the coefficient of thermal expansion between the heat transfer elements and the coolant-carrying structure may be minimized and better distributed across the interface between the multiple heat transfer elements and the coolant-carrying structure. For instance, the plurality of heat transfer elements may comprise a plurality of metal structures, and the coolant-carrying base of the coolant-carrying structure may be a non-metal structure, with the non-metal structure having a different coefficient of thermal expansion than the plurality of metal structures. As a further example, the coolant-carrying base may comprise one or more of the above-noted plastic materials. Further, as noted, the plurality of thermally conductive fins extending from each heat transfer base of the plurality of heat transfer elements may comprise a respective array of thermally conductive pin fins or plate fins extending from that heat transfer base, of the desired configuration.

By way of example, FIGS. 4A-4H depict exemplary embodiments of an apparatus 400, in accordance with one or more aspects of the present invention. As illustrated, in this embodiment, apparatus 400 includes one or more electronic components 401 (FIG. 4A), and a liquid-cooled heat sink assembly 410 (shown in exploded view in FIG. 4A). The one or more electronic components 401 may be disposed, for instance, on a supporting substrate 402, such as a multilayer circuit board, which may facilitate electrical connection of the electronic component(s) to other components of an electronics system.

Referring collectively to FIGS. 4A-4G, liquid-cooled heat sink assembly 410 includes, for instance, a heat transfer element 420 and a coolant-carrying structure 430, which in the depicted embodiment, includes a coolant-carrying base 440, and a manifold structure 445 comprising a manifold 450, and a manifold cover 460. The liquid-cooled heat sink may optionally include an adhesive sealant 425 in certain embodiments to provide or assist in providing a fluid-tight seal between heat transfer element 420 and coolant-carrying structure 430.

Heat transfer element 420 of the heat sink assembly depicted in FIGS. 4A-4G is illustrated as square-shaped or rectangular-shaped, by way of example, and is shown with a footprint slightly smaller than coolant-carrying structure 430, to which heat transfer element 420 couples. As shown, heat transfer element 420 attaches to coolant-carrying structure 430, and in particular, to coolant-carrying base 440, with the illustrated plurality of thermally conductive fins 424 extending into coolant-carrying structure 430.

In one embodiment, liquid-cooled heat sink assembly 410 may be a composite heat sink, with heat transfer element 420 being fabricated of a good thermal conductor, such as a metal, for instance, copper or aluminum, and coolant-carrying structure 430 being fabricated of a different, less expensive, and less thermally conductive material, such as, for instance, a thermoplastic. By way of example, the thermoplastic could comprise Polyethylene (PE), Polypropylene (PP), Polyvinyl Chloride (PVC), Polytetrafluoroethylene (PTFE), Polyether Ether Keytone (PEEK), etc. In a multicomponent coolant-carrying structure 430, such as depicted in FIGS. 4A-4G, coolant-carrying base 440, manifold 450, and manifold cover 460 may each be fabricated of plastic, for example, formed by injection molding, with the components being subsequently bonded together using known plastic-joining techniques, or mechanically coupled using appropriate fasteners and seals.

By way of specific example, one or more of coolant-carrying base 440, manifold 450, and manifold cover 460 may comprise Polyethylene (PE), Polypropylene (PP), or Polyvinyl chloride (PVC), and may be bonded using solvent welding with a bonding media, dependent on the grade. For instance, the bonding media may comprise acetone, dichloromethane (DCM), or a Methyl Ethyl keytone (MEK). Where one or more of coolant-carrying base 440, manifold 450, or manifold cover 460 comprise Polytetrafluoroethylene (PTFE), an IR welding approach may be used to bond the structures together in a fluid-tight manner. Note that the plastics listed above are examples of appropriate plastics that may be employed in a composite heat sink assembly such as described herein. The specific techniques for bonding different plastic components together can vary by grade of plastic, and whether it is filled or unfilled. Other plastics and bonding methods will be apparent to those of ordinary skill in the art given the description provided herein.

In the depicted embodiment, heat transfer element 420 includes a heat transfer base 421 (FIG. 4D) having opposite first and second sides 422, 423, respectively, and a plurality of thermally conductive fins 424 extending from first side 422 thereof. Second side 423 of heat transfer base is sized and configured to couple to at least one electronic component to be cooled, such as electronic component(s) 401. By way of example, in one or more implementations, heat transfer base 421 has a similar footprint to electronic component(s) 401 to be cooled. In one or more implementations, second side 423 functions as a main heat transfer surface and may be, for instance, a flat lower surface of heat transfer base 421. In one or more embodiments, heat transfer base 421 may be a thermally conductive plate appropriately sized to couple and substantially cover the electronic component(s) to be cooled. For instance, for a 1 cm² component, heat transfer base 421 may be a 1 cm² base plate.

Figure 4A:
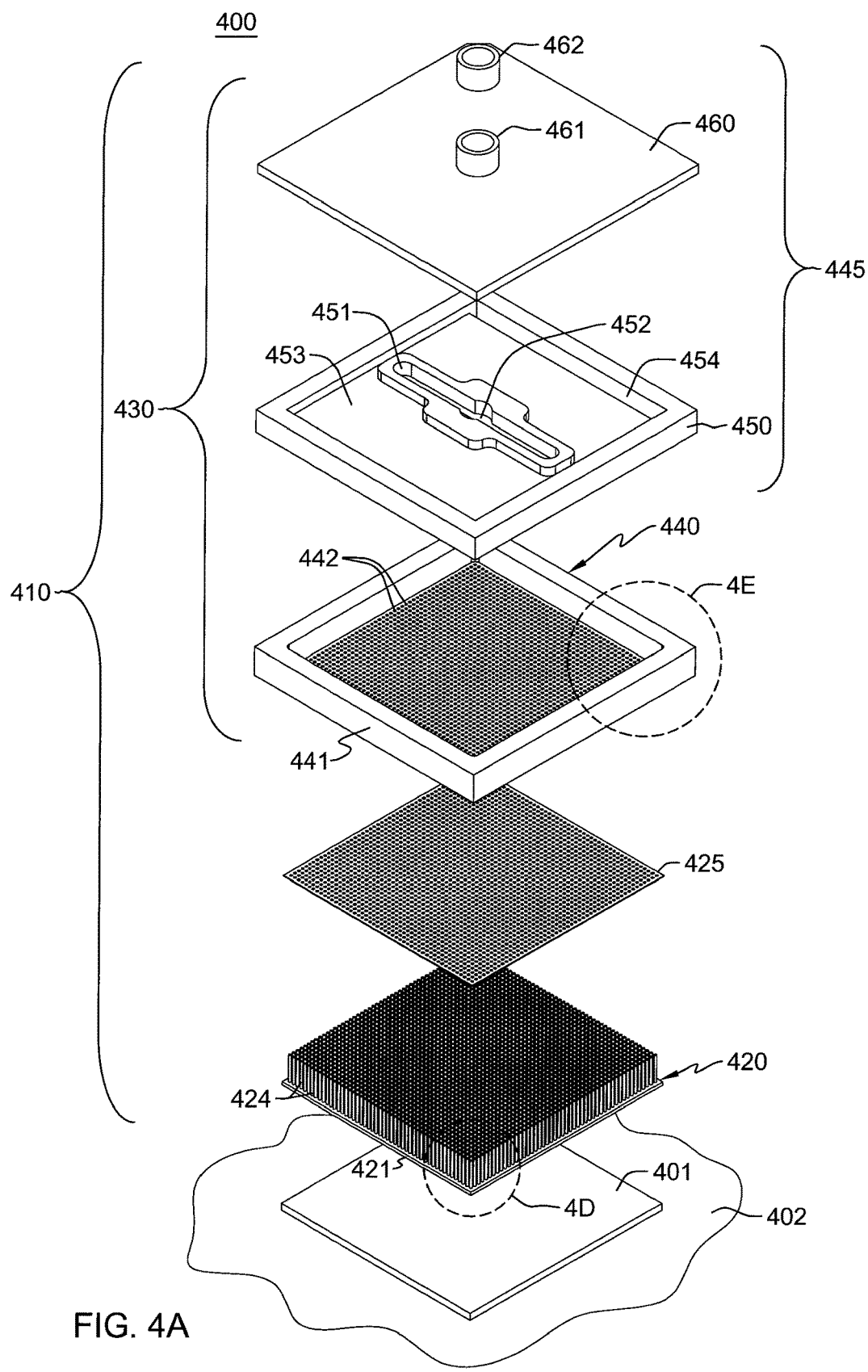
FIG. 4A depicts an exploded view of one embodiment of an apparatus comprising at least one electronic component to be cooled, and a liquid-cooled heat sink assembly, in accordance with one or more aspects of the present invention.
Figure 4B:
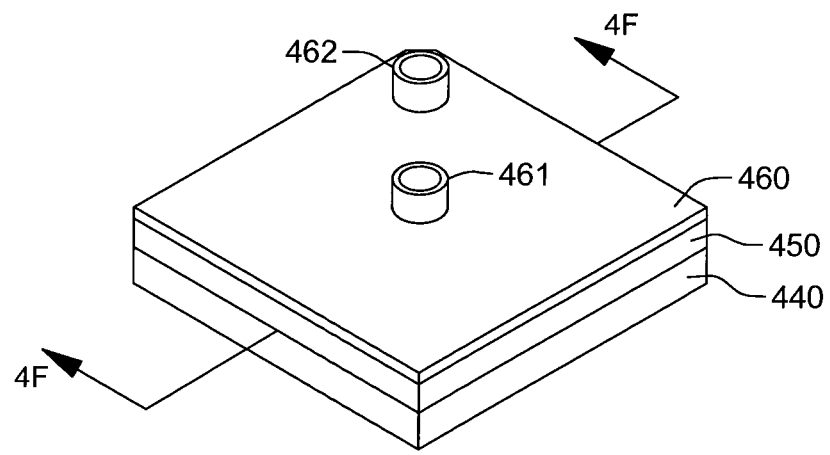
FIG. 4B is a top isometric of the liquid-cooled heat sink assembly embodiment of FIG. 4A, in accordance with one or more aspects of the present invention.
Figure 4C:
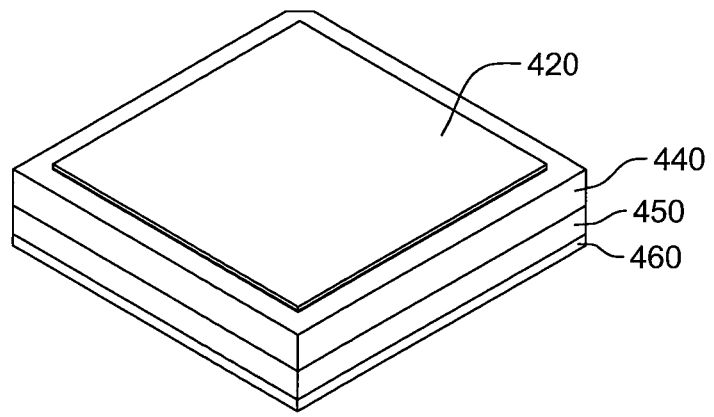
FIG. 4C is a bottom isometric view of the liquid-cooled heat sink assembly of FIGS. 4A & 4B, in accordance with one or more aspects of the present invention.
Figure 4D:
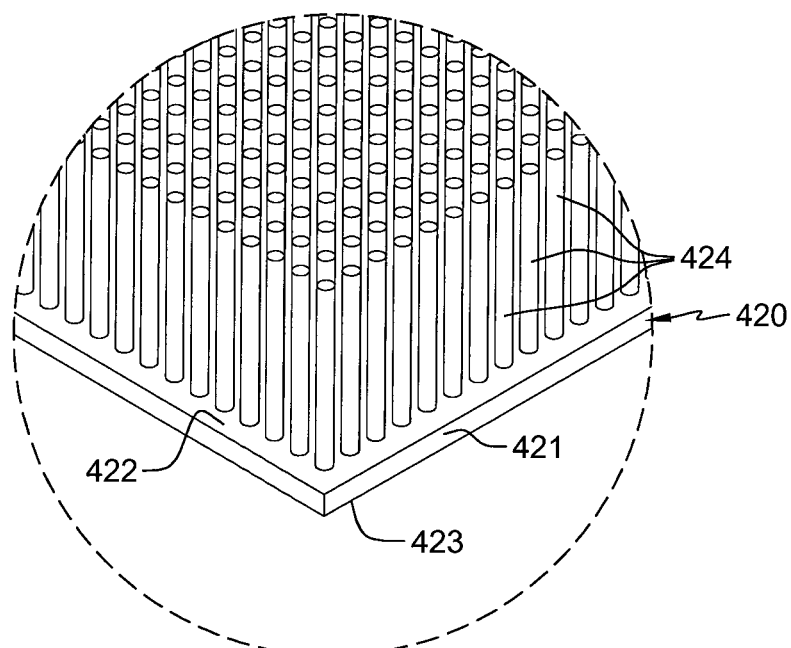
FIG. 4D is a partial, enlarged view of the heat transfer element of the liquid-cooled heat sink assembly of FIG. 4A, taken within region 4D thereof, in accordance with one or more aspects of the present invention.
Figure 4E:
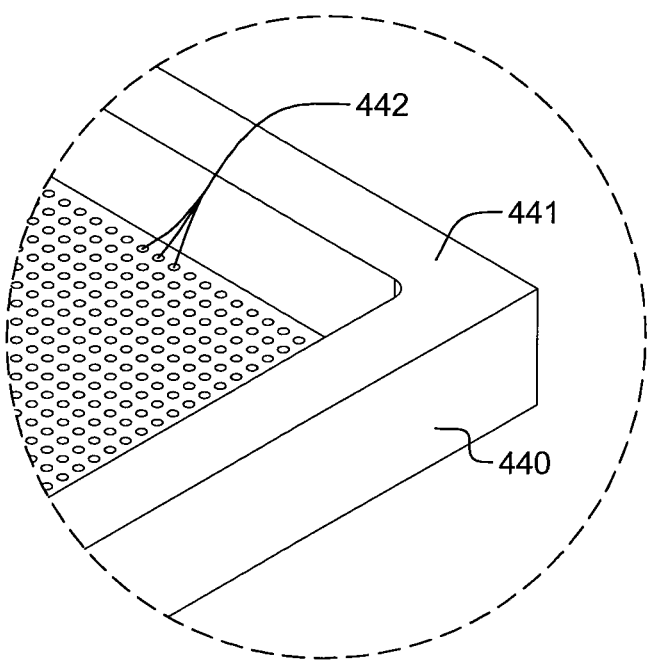
FIG. 4E is a partial, enlarged view of the coolant-carrying base of the liquid-cooled heat sink assembly embodiment of FIG. 4A, taken within region 4E thereof, in accordance with one or more aspects of the present invention.
Figure 4F:
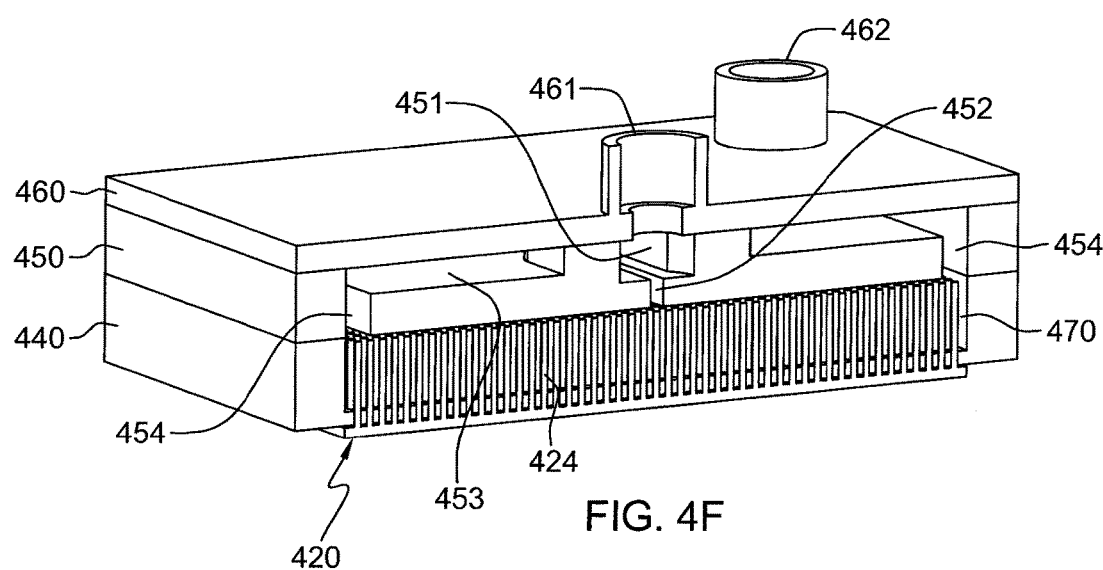
FIG. 4F is a cross-sectional isometric view of the liquid-cooled heat sink assembly of FIG. 4B, taken along line 4F-4F thereof, in accordance with one or more aspects of the present invention.

As specific examples, the plurality of thermally conductive fins may comprise metal pin fins disposed to define an in-line or staggered array of extended surfaces. For instance, the plurality of thermally conductive pin fins could be circular in cross-section, as depicted in FIG. 4D. Alternatively, the plurality of thermally conductive fins could be square-shaped, diamond-shaped, oval-shaped, etc., in cross-section. The heat transfer base 421 of heat transfer element 420 may comprise a metal, such as copper or a copper alloy, or any other suitable good thermal conductor, such as aluminum.

In the example of FIGS. 4A-4G, coolant-carrying base 440 of coolant-carrying structure 430 is illustrated generally as a five-sided cuboid, with a relatively thin base surface and a base side wall 441. The base surface of coolant-carrying base 440 includes a plurality of fin-receiving openings 442 positioned and sized to accommodate a respective thermally conductive fin 424 of heat transfer element 420. For instance, the plurality of thermally conductive fins 424 may comprise an array of pin fins, and the plurality of fin-receiving openings 442 may comprise an array of pin fin-receiving openings, each sized to receive a respective pin fin.

To assemble the liquid-cooled heat sink assembly, the heat transfer element 420 may be joined to the coolant-carrying structure 430. One approach to joining these structures is to use a thermal interference fit (that is, shrink fitting), wherein the plurality of thermally conductive fins fit through the respective plurality of fin-receiving openings in the plastic coolant-carrying base with a predetermined temperature difference established between the plastic (higher temperature) and the metal heat transfer element (lower temperature). When the two parts return to equilibrium, for instance, room temperature, the thermal expansion and/or contraction of the parts will result in a compressive fit between the heat transfer element and the coolant-carrying structure that will provide a fluid-tight seal and prevent liquid from escaping from the coolant-carrying compartment of the coolant-carrying structure during operation. An adhesive joint may alternatively, or additionally, be formed using an adhesive seal 425, such as an epoxy, for redundancy, if desired. Alternatively, a simpler slip-fit with no interference may be employed during assembly, with the adhesive seal 425 providing the fluid-tight seal between heat transfer element 420 and coolant-carrying structure 430. Thereafter, manifold 450 and manifold cover 460, both of which may comprise plastic in one example, may be joined using the above-noted procedures. Note that the manifold 450 and manifold cover 460 illustrated are shown by way of example only. Any number of manifold structures and covers, ranging from a single structure to many structures, could be implemented, depending (for instance) upon the internal flow characteristics desired.

Figure 4G:
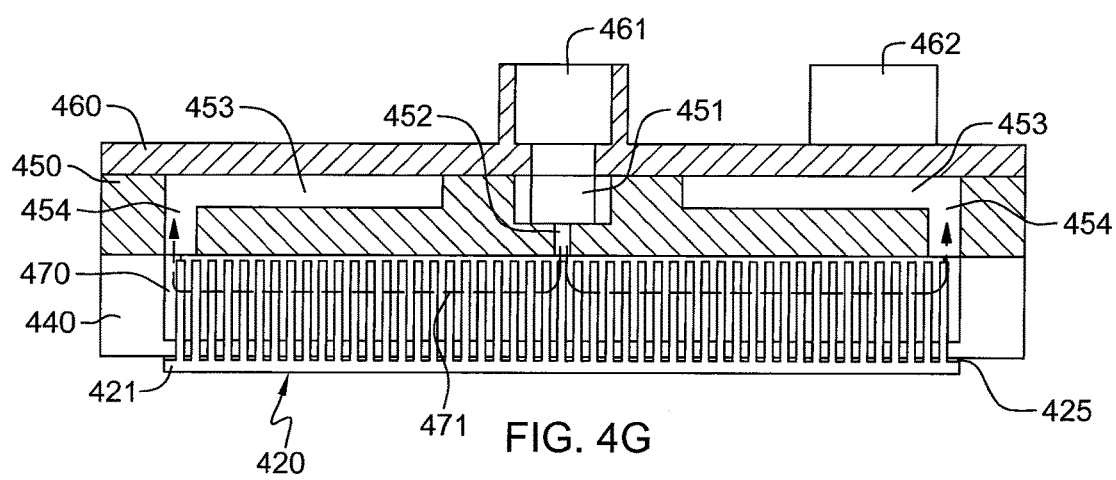
FIG. 4G is an elevational view of the liquid-cooled heat sink assembly of FIG. 4F illustrating one embodiment of liquid coolant flow through the liquid-cooled heat sink assembly, in accordance with one or more aspects of the present invention.
Figure 4H:
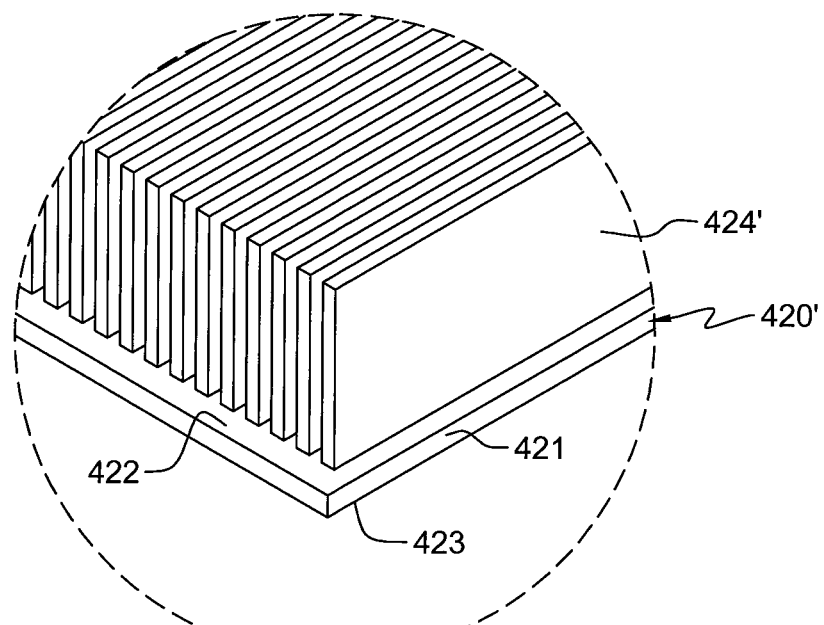
FIG. 4H illustrates a partial, enlarged view of an alternate embodiment of a heat transfer element which may be employed in a liquid-cooled heat sink assembly and apparatus, such as depicted in FIGS. 4A-4G, in accordance with one or more aspects of the present invention.

In one or more embodiments, a coolant-carrying compartment 470 (FIGS. 4F & 4G) may be defined within coolant-carrying structure 430 of liquid-cooled heat sink assembly 410 between coolant-carrying base 440 and manifold 450, as depicted in the illustrated embodiment. When the heat sink is assembled, the plurality of thermally conductive fins 424 extend into coolant-carrying compartment 470 to facilitate transfer of heat from the one or more electronic components 401 to the liquid coolant flowing through coolant carrying compartment 470. In one or more implementations, the height of base side wall 441 is chosen to provide coolant-carrying compartment 470 with sufficient height to accommodate therein the plurality of thermally conductive fins 424 of heat transfer element 420. Note that in other embodiments, multiple coolant-carrying compartments could be defined within coolant-carrying structure 430 to accommodate respective subsets of thermally conductive fins of the plurality of thermally conductive fins, or to accommodate thermally conductive fins from different heat transfer elements, if desired. As illustrated in the example of FIG. 4G liquid coolant 471 enters into coolant carrying compartment 470 in a central region of the coolant-carrying compartment and, for instance, bifurcates for exhausting at opposite peripheries of the liquid-cooled heat sink assembly 410. In the implementation of FIGS. 4A-4G, a centrally located inlet orifice 452 is defined within manifold 450 and two peripheral, outlet orifices 454 are provided at opposite edges of manifold 450. In this example, inlet orifice 452 is configured as an inlet slot orifice, and outlet orifices 454 are configured as outlet slot orifices. Note that the position, shape, and number of inlet and outlet orifices to coolant-carrying compartment 470 may vary as desired, dependent on the particular application.

In the illustrated embodiment, manifold 450 includes a coolant inlet manifold region 451 and a coolant outlet manifold region 453. The one or more inlet orifices 452 and the one or more outlet orifices 454 are respectively in fluid communication with coolant inlet manifold region 451 and coolant outlet manifold region 453, as well as with coolant-carrying compartment 470, defined (in this example) between coolant-carrying base 440 and manifold 450 of manifold structure 445. Further, coolant inlet 461 is in fluid communication with coolant inlet manifold region 451 and coolant outlet 462 is in fluid communication with coolant outlet manifold region 453. In operation, liquid coolant flows (in one example) through coolant inlet 461, coolant inlet manifold region 451 inlet orifice(s) 452, coolant carrying compartment 470, outlet orifice(s) 454, and coolant outlet manifold region 453 to coolant outlet 462. As noted, in the implementation depicted with inlet orifice(s) 452 disposed over the plurality of thermally conductive fins 424 in the central region of coolant-carrying compartment 470, liquid coolant enters coolant-carrying compartment 470 and bifurcates upon contact with coolant-carrying base 440 for outward flow in opposite directions between the plurality of thermally conductive pin fins. Note that the manifold 450 and manifold cover 460 depicted are provided by way of example only. As noted, other configurations of the manifold structure may be employed. Further, note that coolant inlet 461 and coolant outlet 462 are shown simplified for illustration, but may comprise a variety of termination structures, such as hose barbs, threaded connections (SAE, NPT, etc.), or socketed connections for joining to commercially available tube fittings.

Note further that other configurations of thermally conductive fins might be employed. For instance, reference FIG. 4H, where a heat transfer element 420' is depicted substantially identical to heat transfer element 420 of FIGS. 4A-4G, but with a plurality of parallel disposed, thermally conductive plate fins 424'. Other thermally conductive fin configurations and arrays may also be employed, as desired. In each implementation, the plurality of fin-receiving openings in coolant-carrying base 440 are configured and sized to accommodate the respective fins. For instance, if plate fins are provided in heat transfer element 420, then corresponding elongate, rectangular-shaped or slot-shaped openings may be provided in coolant-carrying base 440 to accommodate the respective fins.

Advantageously, in one or more implementations, the heat transfer element 420 and coolant-carrying structure 430 may be separately manufactured, for instance, of separate materials. Disclosed herein in one or more embodiments is a plastic/metal composite liquid-cooled heat sink assembly, wherein the heat transfer element is fabricated of, for instance, a metal, with a plurality of fins extending from one side of the base. Further, the heat sink assembly includes a coolant-carrying structure, fabricated, for instance, of a plastic material. The coolant-carrying structure may include a coolant-carrying base with a plurality of mating openings receiving the plurality of thermally conductive fins extending from the heat transfer base. Different manifolds may be provided in association with the coolant-carrying base to provide, for instance, a bifurcated liquid coolant flow through the coolant carrying compartment, or a cross-flow from one side of the compartment to another, etc. Further, as noted, various inlet and outlet termination ports may be provided, with (for instance) barbs, threads, etc. to facilitate coupling to one or more inlet and outlet conduits facilitating the flow of liquid coolant through the heat sink assembly. In one or more implementations, an interference fit may be provided between the thermally conductive fins and the respective fin-receiving openings. If desired, an adhesive sealant may optionally be used between the plastic coolant-carrying structure and the metal heat transfer element.

Depending upon the size of the liquid-cooled heat sink assembly, and in particular, the size of the heat transfer element, interference-fitting the metal heat transfer element with the plastic coolant-carrying base may be prohibitive. For instance, the magnitude of thermal expansion/contraction varies linearly with the distance from a neutral (non-varying) point in the part outwards. In this example, the neutral point in the assembly would be the center point of the heat transfer element, and in particular, the center point of the heat transfer base, in one example. In order to maintain the distance from neutral point (DNP) stresses in check, multiple heat transfer elements, and specifically, multiple metal heat transfer elements, may be coupled into a plastic coolant-carrying base of a coolant-carrying structure, as illustrated in FIGS. 5A-5C.

Figure 5A:
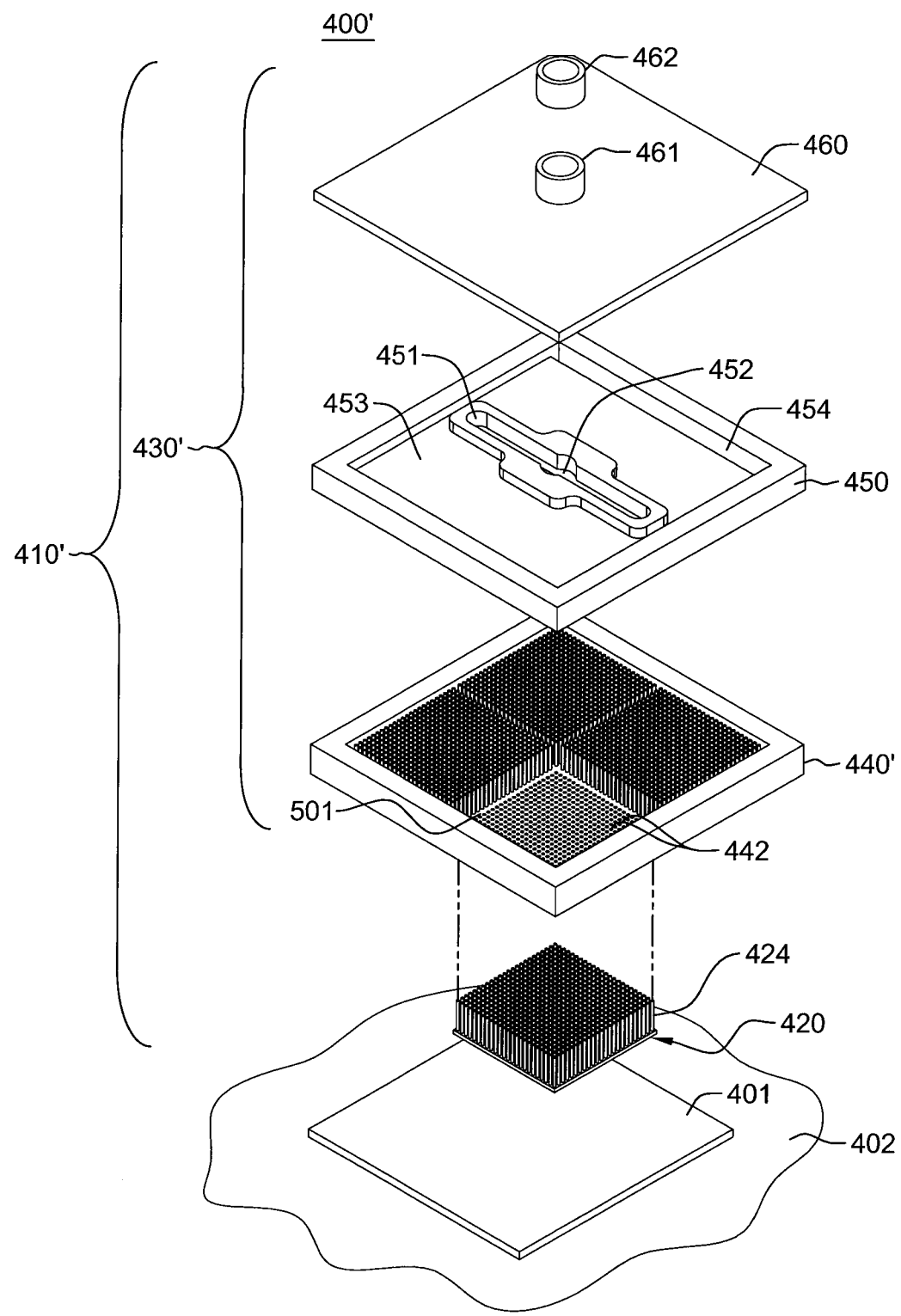
FIG. 5A depicts an exploded view of another embodiment of an apparatus comprising at least one electronic component to be cooled, and a liquid-cooled heat sink assembly, in accordance with one or more aspects of the present invention.

Referring collectively to FIGS. 5A-5C, another embodiment of an apparatus 400' comprising at least one electronic component 401 to be cooled, and a liquid-cooled heat sink assembly 410', is illustrated. In this configuration, liquid-cooled heat sink assembly 410' may be substantially identical to liquid-cooled heat sink assembly 410 of FIGS. 4A-4G, described above, with the exception of the heat sink subassembly comprising, by way of example, multiple heat transfer elements 420 and coolant-carrying base 440' of the coolant-carrying structure 430'. In the embodiment illustrated, four (4) heat transfer elements 420 are shown coupled to coolant-carrying base 440', with the respective pluralities of thermally conductive fins 424 extending through respective pluralities of fin-receiving openings 442 in coolant-carrying base 440' into the coolant-carrying compartment of the liquid-cooled heat sink assembly 410', for instance, in a manner such as described above in connection with the embodiment of FIGS. 4A-4G. Note that in the exemplary embodiment provided, a gap 501 is provided between the heat transfer elements 420 when coupled to the coolant-carrying base 440'. Those skilled in the art should note that any number and any configuration of heat transfer elements 420 could be provided in combination with the coolant-carrying base 440', depending upon the desired distance from neutral point stress resulting from fabrication of the liquid-cooled heat sink assembly 410' using (for instance) an interference shrink fitting of the metal heat transfer elements 420 and the plastic coolant-carrying base 440' to ensure a fluid-tight seal therebetween. The 2×2 array of heat transfer elements 420 is presented by way of example only, and that other arrays, such as 1×2, 2×3, 3×3, etc., may be employed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. An apparatus comprising:
   a liquid-cooled heat sink assembly including:
      a heat transfer element comprising a heat transfer base having opposite first and second sides, and a plurality of thermally conductive fins extending from the first side of the heat transfer base, the second side of the heat transfer base to couple to at least one electronic component to be cooled; and
      a coolant-carrying structure attached to the heat transfer element, the coolant-carrying structure including:
         a coolant-carrying base, the coolant-carrying base comprising a base surface with a plurality of fin-receiving openings sized and positioned for the plurality of thermally conductive fins of the heat transfer base to extend therethrough, and a base side wall extending from the base surface, the base side wall and the base surface defining, in part, a coolant-carrying compartment through which liquid coolant flows;
         a manifold structure attached to the base side wall of the coolant-carrying base and facilitating defining, in part, the coolant-carrying compartment through which the liquid coolant flows, the manifold structure being an injection-molded structure comprising:
            a manifold base sized to cover the coolant-carrying base and attach at a first side to the base side wall extending from the base surface of the coolant-carrying base, the manifold base including a second side with a manifold side wall extending therefrom that facilitates defining a coolant outlet manifold region, in part, over the manifold base, the first side and the second side of the manifold base being opposite sides of the manifold base; and wherein the manifold structure further includes a coolant inlet manifold region defined over the manifold base and within, in part, an area of the base manifold encircled by the manifold side wall;

a manifold cover overlying the manifold base, including over the coolant inlet manifold region and the coolant outlet manifold region defined within the manifold base;

wherein the plurality of thermally conductive fins extend through the coolant-carrying base into the coolant-carrying compartment of the coolant-carrying structure through which liquid coolant flows, and wherein the liquid coolant is received into and flows from the coolant inlet manifold region of the manifold structure into the coolant-carrying compartment with the plurality of thermally conductive fins, and from the coolant-carrying compartment into the coolant outlet manifold region of the manifold structure before exhausting from the liquid-cooled heat sink.

2. The apparatus of claim 1, wherein the liquid-cooled heat sink assembly is a composite liquid-cooled heat sink assembly, with the heat transfer element being a metal structure, and the coolant-carrying structure being a plastic structure.

3. The apparatus of claim 2, wherein the plurality of thermally conductive fins of the heat transfer element comprise an array of thermally conductive pin fins extending from the heat transfer base.

4. The apparatus of claim 1, wherein the liquid-cooled heat sink assembly further comprises a fluid-tight seal between the heat transfer element and the coolant-carrying structure, and the plurality of fin-receiving openings are sized and configured to provide an interference fit of the plurality of thermally conductive fins therein, the interference fit facilitating providing the fluid-tight seal between the heat transfer base and the coolant-carrying structure.

5. The apparatus of claim 1, wherein the liquid-cooled heat sink assembly comprises a fluid-tight seal between the heat transfer element and the coolant-carrying structure, and the liquid-cooled heat sink assembly further comprises an adhesive sealant between the first side of the heat transfer base of the heat transfer element and the coolant-carrying base of the coolant-carrying structure, the adhesive sealant facilitating providing the fluid-tight seal between the heat transfer element and the coolant-carrying structure.

6. The apparatus of claim 1, wherein the manifold structure comprises:

a coolant inlet and a coolant outlet; and at least one inlet orifice in fluid communication with the coolant inlet and the coolant-carrying compartment, and at least one outlet orifice in fluid communication with the coolant outlet and the coolant-carrying compartment, wherein the liquid coolant flows through the coolant inlet, the at least one inlet orifice, the coolant inlet manifold region, the coolant-carrying compartment, the coolant outlet manifold region, and the at least one outlet orifice, to the coolant outlet.

7. The apparatus of claim 6, wherein the at least one inlet orifice of the manifold structure comprises at least one inlet slot positioned over a central region of the coolant-carrying compartment and facilitating the liquid coolant flow into the coolant-carrying compartment in the central region thereof.

8. The apparatus of claim 1, wherein the liquid-cooled heat sink assembly comprises a plurality of heat transfer elements, the heat transfer element being one heat transfer element of the plurality of heat transfer elements, and wherein each heat transfer element of the plurality of heat transfer elements comprises a respective heat transfer base having opposite first and second sides, and a respective plurality of thermally conductive fins extending from the first side thereof, and wherein the plurality of heat transfer elements of the liquid-cooled heat sink assembly are attached to the coolant-carrying structure and spaced apart with a gap therebetween, with the respective pluralities of thermally conductive fins extending through respective pluralities of fin-receiving openings in the coolant-carrying base into the coolant-carrying compartment.

9. The apparatus of claim 8, wherein the respective pluralities of thermally conductive fins extending from the first side of at least one heat transfer base of at least one heat transfer element of the plurality of heat transfer elements comprise a respective array of thermally conductive pin fins extending from the heat transfer base.

10. The apparatus of claim 8, wherein the liquid-cooled heat sink assembly is a composite liquid-cooled heat sink assembly, with the plurality of heat transfer elements being a plurality of metal structures, and the coolant-carrying structure being a plastic structure.

11. An apparatus comprising:

at least one electronic component to be cooled; and a liquid-cooled heat sink assembly coupled to the at least one electronic component to facilitate cooling thereof, the liquid-cooled heat sink assembly including:

a heat transfer element comprising a heat transfer base having opposite first and second sides, and a plurality of thermally conductive fins extending from the first side of the heat transfer base, the second side of the heat transfer base being coupled to the at least one electronic component to be cooled; and a coolant-carrying structure attached to the heat transfer element, the coolant-carrying structure including a coolant-carrying base, the coolant-carrying base comprising a base surface with a plurality of fin-receiving openings sized and positioned for the plurality of thermally conductive fins of the heat transfer base to extend therethrough, and a base side wall extending from the base surface, the base side wall and the base surface defining, in part, a coolant-carrying compartment through which liquid coolant flows;

a manifold structure attached to the base side wall of the coolant-carrying base and facilitating defining, in part, the coolant-carrying compartment through which the liquid coolant flows, the manifold structure being an injection-molded structure comprising:

a manifold base sized to cover the coolant-carrying base and attach at a first side to the base side wall extending from the base surface of the coolant-carrying base, the manifold base including a second side with a manifold side wall extending therefrom that facilitates defining a coolant outlet manifold region, in part, over the manifold base, the first side and the second side of the manifold base being opposite sides of the manifold base; and wherein the manifold structure further includes a coolant inlet manifold region defined over the manifold base and within, in part, an area of the base manifold encircled by the manifold side wall;

a manifold cover overlying the manifold base, including over the coolant inlet manifold region and the coolant outlet manifold region defined within the manifold base;

wherein the plurality of thermally conductive fins extend through the coolant-carrying base into the coolant-carrying compartment of the coolant-carrying structure through which liquid coolant flows, and wherein the liquid coolant is received into and flows from the coolant inlet manifold region of the manifold structure into the coolant-carrying compartment with the plurality of thermally conductive fins, and from the coolant-carrying compartment into the coolant outlet manifold region of the manifold structure before exhausting from the liquid-cooled heat sink.

12. The apparatus of claim 11, wherein the liquid-cooled heat sink assembly is a composite liquid-cooled heat sink assembly, with the heat transfer element being a metal structure, and the coolant-carrying structure being a plastic structure.

13. The apparatus of claim 12, wherein the plurality of thermally conductive fins of the heat transfer element comprise an array of thermally conductive pin fins extending from the heat transfer base.

14. The apparatus of claim 11, wherein the liquid-cooled heat sink assembly further comprises a fluid-tight seal between the heat transfer element and the coolant-carrying structure, and the plurality of fin-receiving openings are sized and configured to provide an interference fit of the plurality of thermally conductive fins therein, the interference fit facilitating providing the fluid-tight seal between the heat transfer base and the coolant-carrying structure.

15. The apparatus of claim 11, wherein the liquid-cooled heat sink assembly comprises a fluid-tight seal between the heat transfer element and the coolant-carrying structure, and the liquid-cooled heat sink assembly further comprises an adhesive sealant between the first side of the heat transfer base of the heat transfer element and the coolant-carrying base of the coolant-carrying structure, the adhesive sealant facilitating providing the fluid-tight seal between the heat transfer element and the coolant-carrying structure.

16. The apparatus of claim 11, wherein the liquid-cooled heat sink assembly comprises a plurality of heat transfer elements, the heat transfer element being one heat transfer element of the plurality of heat transfer elements, and wherein each heat transfer element of the plurality of heat transfer elements comprises a respective heat transfer base having opposite first and second sides, and a respective plurality of thermally conductive fins extending from the first side thereof, and wherein the plurality of heat transfer elements of the liquid-cooled heat sink assembly are attached to the coolant-carrying structure and spaced apart with a gap therebetween, with the respective pluralities of thermally conductive fins extending through respective pluralities of fin-receiving openings in the coolant-carrying base into the coolant-carrying compartment.

17. The apparatus of claim 16, wherein the liquid-cooled heat sink assembly is a composite liquid-cooled heat sink assembly, with the plurality of heat transfer elements being a plurality of metal structures, and the coolant-carrying structure being a plastic structure.

* * * * *